United States Patent
Bordelon, Jr. et al.

(10) Patent No.: US 8,716,097 B2
(45) Date of Patent: May 6, 2014

(54) MOS TRANSISTORS HAVING REDUCED LEAKAGE WELL-SUBSTRATE JUNCTIONS

(75) Inventors: Terry James Bordelon, Jr., Flower Mound, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 13/584,016

(22) Filed: Aug. 13, 2012

(65) Prior Publication Data

US 2014/0042545 A1 Feb. 13, 2014

(51) Int. Cl.
*H01L 21/20* (2006.01)
*H01L 29/93* (2006.01)

(52) U.S. Cl.
USPC .......................................... 438/380; 257/597

(58) Field of Classification Search
USPC ................... 257/312, 480, 595–599, E27.03, 257/E27.041; 438/380, 517
See application file for complete search history.

(56) References Cited

U.S. PATENT DOCUMENTS

| | | | | |
|---|---|---|---|---|
| 5,719,422 A | * | 2/1998 | Burr et al. | 257/336 |
| 6,275,059 B1 | * | 8/2001 | Sah et al. | 324/762.05 |
| 6,667,205 B2 | | 12/2003 | Breitwisch et al. | |
| 7,189,997 B2 | * | 3/2007 | Tsunoda et al. | 257/72 |
| 7,268,049 B2 | * | 9/2007 | Zhu et al. | 438/300 |
| 8,304,835 B2 | * | 11/2012 | Bulucea et al. | 257/368 |
| 2008/0099852 A1 | | 5/2008 | Faul | |
| 2012/0135582 A1 | | 5/2012 | Ikeda | |

* cited by examiner

*Primary Examiner* — Calvin Lee
(74) *Attorney, Agent, or Firm* — Jacqueline J. Garner; Wade J. Brady, III; Frederick J. Telecky, Jr.

(57) ABSTRACT

A Metal-Oxide Semiconductor (MOS) transistor includes a substrate having a topside semiconductor surface doped with a first dopant type having a baseline doping level. A well is formed in the semiconductor surface doped with a second doping type. The well forms a well-substrate junction having a well depletion region. A retrograde doped region is below the well-substrate junction doped with the first dopant type having a peak first dopant concentration of between five (5) and one hundred (100) times above the baseline doping level at a location of the peak first dopant concentration, wherein with zero bias across the well-substrate junction at least (>) ninety (90) % of a total dose of the retrograde doped region is below the bottom of the well depletion region. A gate structure is on the well. Source and drain regions are on opposing sides of the gate structure.

19 Claims, 3 Drawing Sheets

MOS TRANSISTORS HAVING REDUCED LEAKAGE WELL-SUBSTRATE JUNCTIONS

FIELD

Disclosed embodiments relate to semiconductor devices including integrated circuits having pn junctions, including doping arrangements for reducing pn junction leakage.

BACKGROUND

Leakage current has become a significant contributor to standby power dissipation of Complementary Metal-Oxide Semiconductor (CMOS) integrated circuits (ICs), and is commonly measured at the transistor level by the transistor parameter off-state current (Ioff). Ioff is the drain current when the applied gate voltage is zero, with some applied drain-to-source voltage (Vdd).

Ioff is influenced by the device's threshold voltage (Vt), channel physical dimensions, channel/surface doping profile, drain/source junction depth, gate dielectric thickness, and Vdd. Ioff in long-channel devices is known to be dominated by reverse-bias leakage from the drain-well junctions and the well-substrate junctions. Short-channel transistors typically require lower power supply levels to reduce their internal electric fields and power consumption. Use of lower power supply levels forces a reduction in the Vt, which can cause a substantial increase in Ioff. Accordingly, IC standby power can be reduced if reverse bias well-substrate leakage can be reduced.

SUMMARY

Disclosed embodiments include methods for forming Metal-Oxide Semiconductor (MOS) transistors and ICs therefrom including at least one high energy implant for enhancing (increasing) the substrate doping below the bottom of the depletion region of the well-substrate junction (well depletion region) to add a retrograde doped region within one (1) diffusion length of the bottom of this depletion region. The increased substrate doping level significantly reduces junction leakage by reducing the minority carrier doping level below the well depletion region.

In the case of an nwell in a p-substrate, it has been found one or more high energy boron implants between the bottom of the nwell depletion region and one diffusion length below beyond reduces the nwell to the surrounding p-type substrate junction leakage. Alternatively, if the substrate material is n-type, and the well is a pwell, one or more n-type implants (P, As, or Sb) can be positioned below the pwell to reduce pwell to the surrounding n-type substrate junction leakage.

Disclosed retrograde doped regions are positioned in an appropriate depth range so that they are deep enough to not significantly alter electrical characteristics of devices within the well including the threshold voltages ($V_t$) of MOS devices in the well, the well-substrate breakdown voltage and well-substrate capacitance. This positioning is also close enough (within 1 diffusion length) to significantly increase the doping level in the substrate doping near the bottom of the well-substrate junction to reduce the minority carrier doping level therein to reduce the well-substrate junction leakage.

Disclosed retrograde doped regions below the well-substrate junction generally have a peak dopant concentration of 5 to 100 times above the baseline doping level provided by the surrounding substrate at the location (i.e. depth) of the peak dopant concentration. For example, for a p-substrate having a boron doping level of $1\times10^{15}$ cm$^{-3}$, the retrograde doped regions below the well-substrate junction provide a peak boron concentration of from $5\times10^{15}$ cm$^{-3}$ to $1\times10^{17}$ cm$^{-3}$. In addition, with zero bias across the well-substrate junction at least (>) ninety (90) % of a total (integrated) dose of the retrograde doped region is below the bottom of the well depletion region. As implanted, typically >95% (e.g., >99%) of the high energy implant dose(s) are below a bottom of the well depletion region, while in the completed IC the percentage may drop to at least (>) ninety (90) % due to post-implant diffusion.

One disclosed embodiment is a MOS transistor including a substrate having a semiconductor surface doped with a first dopant type having a baseline doping level. A well is formed in the semiconductor surface doped with a second doping type. The well forms a well-substrate junction having a well depletion region. A retrograde doped region is below the well-substrate junction doped with the first dopant type having a peak first dopant concentration of between five (5) and one hundred (100) times above the baseline doping level at a location of the peak first dopant concentration, wherein with zero bias across the well-substrate junction at least (>) ninety (90) % of a total dose of the retrograde doped region is below the bottom of the well depletion region. A gate structure on the well. Source and drain regions are on opposing sides of the gate structure.

BRIEF DESCRIPTION OF THE DRAWINGS

Reference will now be made to the accompanying drawings, which are not necessarily drawn to scale, wherein:

FIG. 2A illustrates two example high energy implant conditions which form a retrograde doped region that increases the p-type doping in the substrate below the nwell shown, while

DETAILED DESCRIPTION

Figure 1:
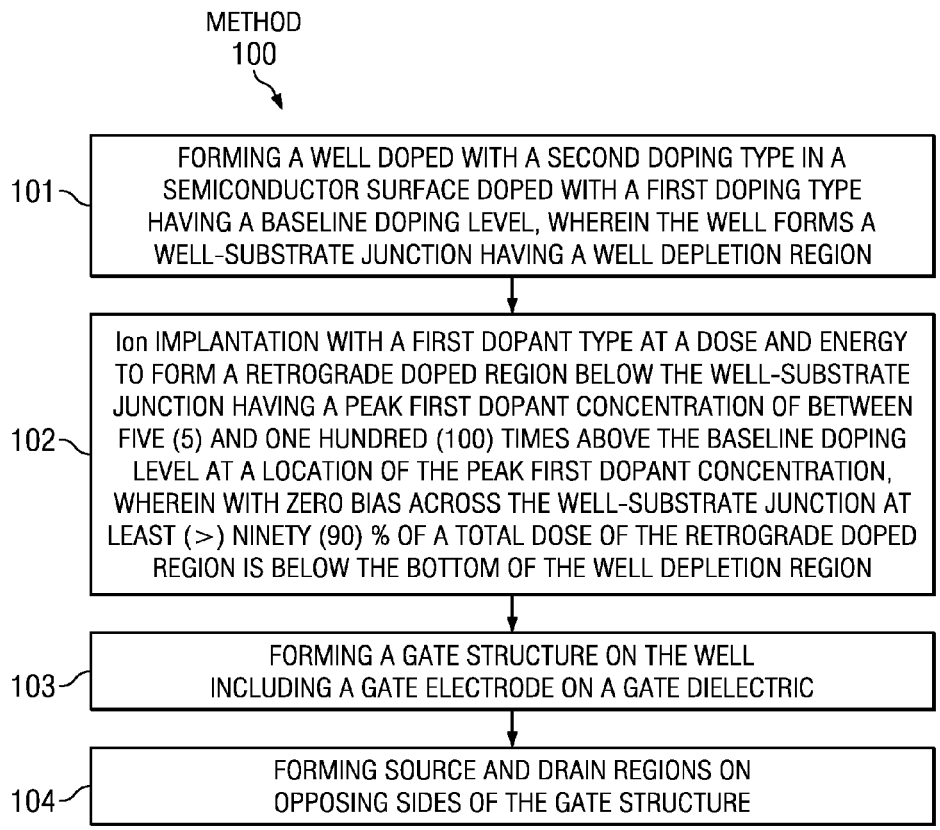
FIG. 1 is a flow chart that shows steps in an example method including at least one high energy implant for forming a MOS transistor including a well-substrate junction having a retrograde doped region below the well depletion region for reducing leakage, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 including at least one high energy implant for enhancing (increasing) the substrate doping below the well-substrate junction's depletion region to add a retrograde doped region below the junction for forming a MOS transistors having a reduced leakage well-substrate junction, according to an example embodiment. The well-substrate junction leakage is reduced by increasing the substrate surface doping between the bottom of well depletion region and 1 diffusion length out from the well depletion region, thus reducing the minority carrier doping level, without significantly altering electrical characteristics of devices within the well, including the Vt and junction capacitance of MOS devices within the well. A typical value for a diffusion length for a well-substrate junction may be from 5 to 20 μm.

Step 101 comprises forming a well doped with a second doping type in a semiconductor surface doped with a first dopant type having a baseline doping level, wherein the well forms a well-substrate junction. The well can be an n-well, and the semiconductor surface a p− surface, such as a bulk p− substrate, or a p-epi layer on a p+ substrate. The well can be a p-well and the semiconductor surface an n− surface, such as a bulk n-substrate, or a n-epi layer on a n+ substrate. Well formation can comprise conventional well formation using at least one ion implant followed by an anneal/drive. The substrate can comprise silicon, silicon-germanium, or other substrate material that provides a semiconductor surface.

Step 102 comprises ion implantation with a first dopant type (same type as the semiconductor substrate surface) at a dose and energy to form a retrograde doped region below the well depletion region of the well-substrate junction, having a peak first dopant concentration of five (5) to one hundred (100) times the baseline doping level at a location of the peak first dopant concentration. The implant energies are selected so that after ion implantation, with zero bias across the well-substrate junction, at least (>) ninety (90) % of a total dose of the retrograde doped region is below the bottom of the well depletion region, and in one embodiment at least 80% of the implanted dose is also within two (2) μm from the bottom of the well depletion region.

Figure 2A:
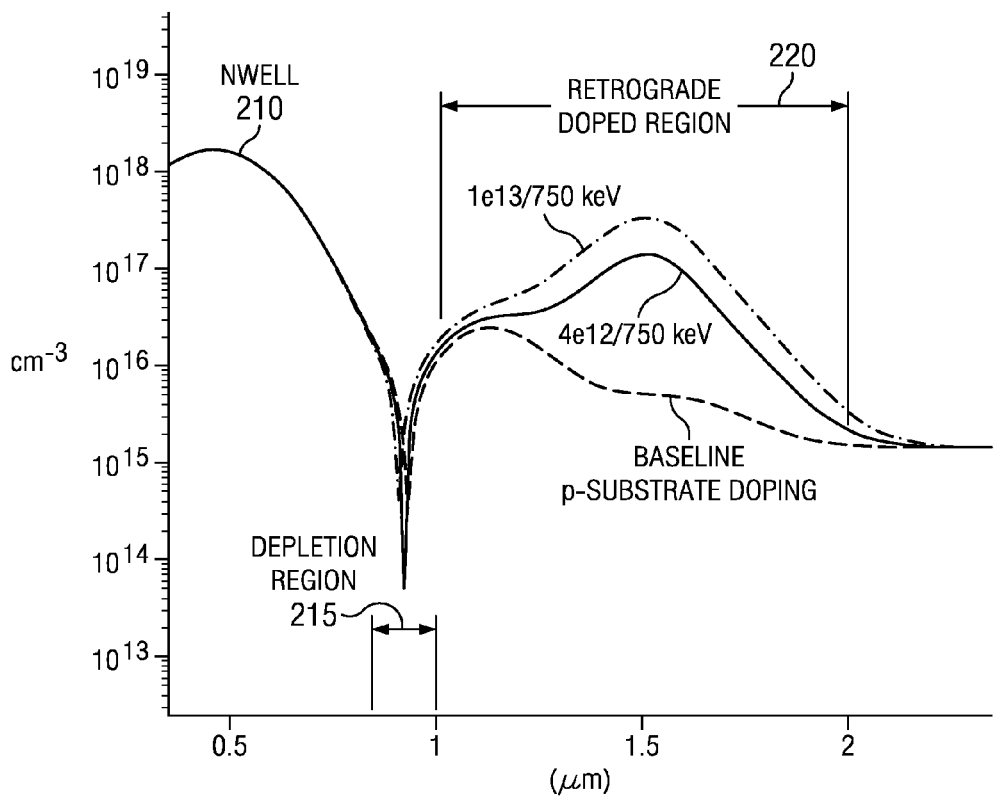

FIG. 2A described below shows example dopant profiles as well as the baseline doping profile provided by the semiconductor substrate surface. In one embodiment the implantation is a blanket ion implantation, so that no added mask levels are needed. In another embodiment, a set of one or more implants may be masked to apply the resulting leakage reduction to selected wells while masking the high energy implant(s) to maintain high substrate resistivity in other wells and regions (e.g., under integrated inductors).

In the case of a nwell in p-substrate surface, the first dopant type is generally boron, and the implant dose is generally between $2 \times 10^{12}$ cm$^{-2}$ and $3 \times 10^{13}$ cm$^{-2}$, and the energy is generally from 400 keV to 1.8 MeV, but can be at a higher energy provided the dose remains within one diffusion length of the bottom of the well depletion region. The ion implantation can includes at least two different implants having different implant energies, such as the 3 separate implants described below relative to FIG. 2B.

Step 103 comprises forming a gate structure on the well including a gate electrode on a gate dielectric. Step 104 comprises forming source and drain regions on opposing sides of the gate structure. Although not described relative to method 100, disclosed methods generally include conventional CMOS processing including forming isolation (e.g., shallow trench isolation), lightly doped drains, spacers, various channel implants, multi-level metallization, and passivation processing.

FIG. 2A illustrates simulations of two example high energy implant conditions which form a retrograde doped region that significantly increases the p-type doping in the substrate below the nwell-substrate depletion region 215. The example implant conditions are shown as a $^{11}B^+$ dose of $4 \times 10^{12}$ cm$^{-2}$ at 750 keV, and a $^{11}B^+$ dose of $1 \times 10^{13}$ cm$^{-2}$ at 750 keV.

The baseline condition is shown as "baseline p-substrate doping", where there is no addition of a disclosed high energy implant. The baseline p-substrate doping profile shown is not constant as a function of depth due to the addition of an optional blanket boron implant for improving the nwell-to-nwell isolation. The position of peak doping for each of the boron high energy implant is set by the implant energy (and stopping power of the substrate) such that implanted profile encroaches minimally into the nwell 210 and nwell-substrate depletion region 215. The retrograde doped region 220 is below the nwell-substrate depletion region 215 and has a peak dopant concentration about 1.5 μms from the surface of the device (about $1 \times 10^{17}$ cm$^{-3}$ for the $4 \times 10^{12}$ cm$^{-2}$ dose and about $3 \times 10^{17}$ cm$^{-3}$ for the $1 \times 10^{13}$ cm$^{-2}$ dose) which is more that an order of magnitude above the baseline p-substrate doping level at the depth of the peak dopant concentration which is about $4 \times 10^{15}$ cm$^{-3}$ at 1.5 μms from the surface. Substantially all of the retrograde doped region 220 can be seen to be positioned between a bottom of the well depletion region 215 and two (2) microns from the bottom of well depletion region 215.

The implant dose can be set to reduce the leakage within the constraints a) ability to adequately anneal out implant damage from the high energy implant(s) to the crystal and b) to prevent an increase of the depletion region electric field caused by encroachment of dopant from the high energy implant into the well depletion region. Multiple (additive) high energy implants may be used with different dose and energy combinations, such as described below relative to FIG. 2B to achieve increased leakage suppression given other design constraints (e.g., well breakdown voltage, well capacitance, deep substrate resistivity).

Figure 2B:
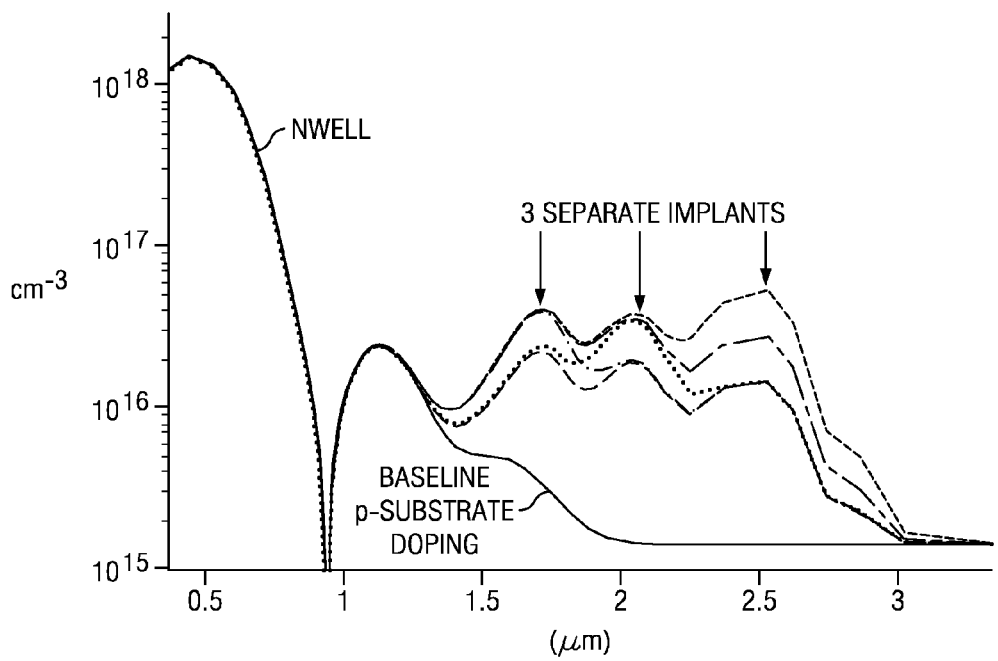
FIG. 2B illustrates the doping profile of a disclosed retrograde doped region formed using three separate high energy implant conditions to increase the p-substrate doping below the nwell. The baseline conditions are shown as "baseline p-substrate doping", where there is no addition of any disclosed high energy implant.

Disclosed retrograde doped regions may be contrasted with conventional deep implants used for CMOS latchup suppression and well-to-well isolation. Disclosed retrograde doped regions involve a different design objective and subsequent well design and doping profile for achieving reduced leakage, being suppression of minority carriers within a diffusion length of the well depletion region to reduce junction leakage. Implanted profiles for leakage reduction are at a lower concentration as compared to buried layers and doped regions suited for well-to-well leakage reduction. FIG. 2B illustrates the doping profile of a disclosed retrograde doped region formed using three separate high energy implant conditions to increase the p-substrate doping below an nwell. As in FIG. 2A, the baseline condition is shown as "baseline p-substrate doping", where there is no addition of any disclose high energy implant.

Figure 3:
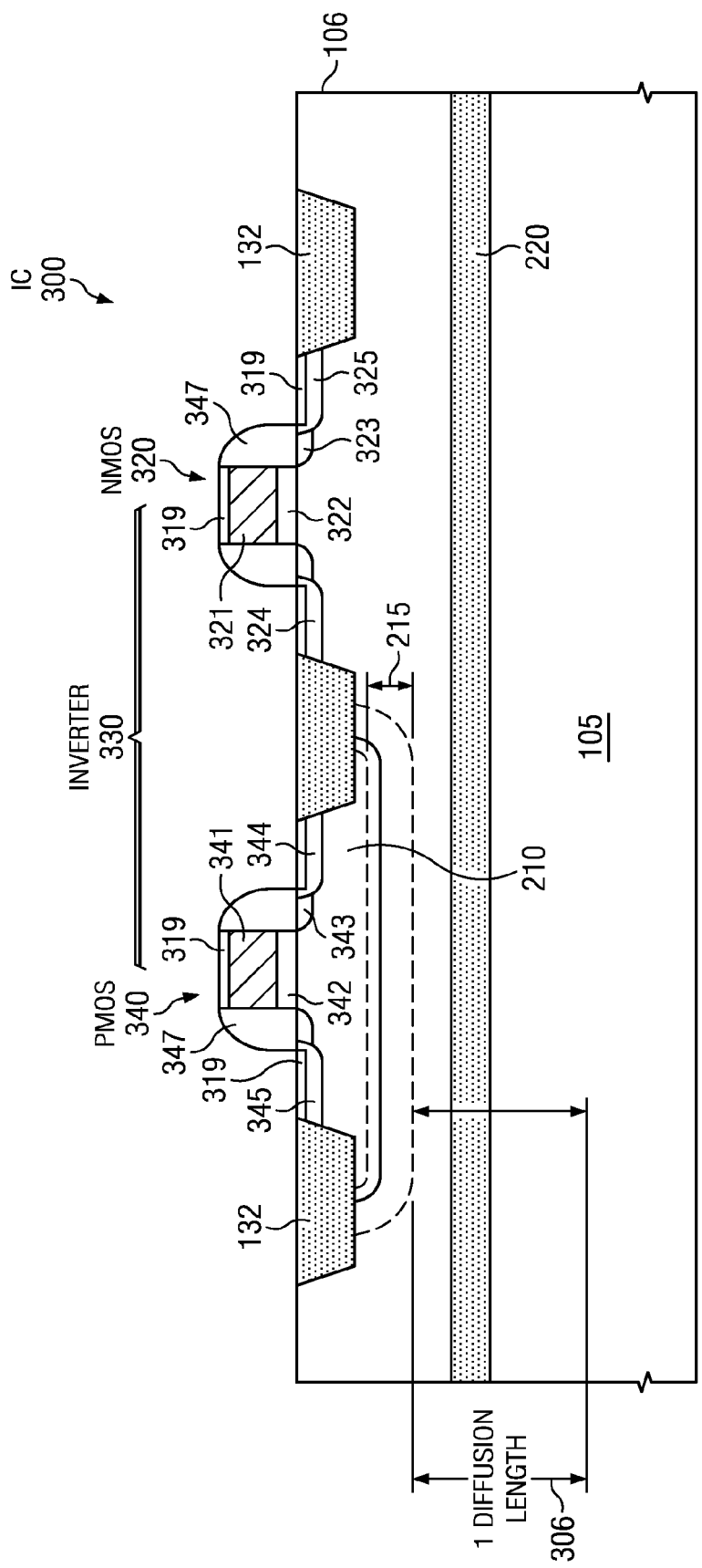
FIG. 3 is a simplified cross sectional depiction of an IC showing a CMOS inverter in a topside semiconductor surface of a substrate, where the PMOS transistor is in an nwell having a retrograde doped region below the nwell to provide a disclosed reduced leakage well-substrate diode, according to an example embodiment.

FIG. 3 is a simplified cross sectional depiction of an IC 300 showing a CMOS inverter 330 in a topside semiconductor surface 106 of a substrate 105, where the PMOS transistor 340 is in an nwell 210 having a retrograde doped region 220 between the bottom of the nwell-substrate depletion region 215 and the one (1) diffusion length 306 shown to provide a disclosed reduced leakage well-substrate diode, according to an example embodiment. The CMOS inverter 330 comprises an NMOS transistor 320 and PMOS transistor 340 (coupling between NMOS transistor 320 and PMOS transistor 340 not shown). Substrate 105 can be a p-substrate or a p-epi layer on a p+ substrate. Dielectric isolation is shown as trench isolation 132.

Although the topside semiconductor surface 106 is described in FIG. 3 as being p-type, in another embodiment the topside semiconductor surface 106 can be n-type, the well a pwell, and the MOS transistor having a disclosed reduced leakage well-substrate diode can be an n-channel MOS transistor. Moreover, although not shown, IC 300 generally includes a large number of MOS transistors and other circuit elements, such as capacitors, resistors, capacitors, diodes, etc. In addition, although not shown, IC 300 includes functional circuitry, which is circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex device. The specific functionality contained within functional circuitry is not of importance to disclosed embodiments.

Although only one nwell 210 is shown, disclosed ICs generally includes a plurality of nwells 210. Retrograde doped region 220 is shown as blanket doped region. However, in other embodiments, the retrograde doped region 220 can be a patterned region, so that a portion of the plurality of nwells or other regions on the IC do not include the retrograde doped region 220, such as for integrated inductors.

PMOS transistor 340 comprises gate electrode 341, gate dielectric 342, sidewall spacer 347, lightly doped drains 343, source 344, and drain 345, with a silicide layer 319 on the source 344, drain 345, and gate electrode 341 for the case the gate electrode 341 comprises polysilicon. NMOS transistor 320 comprises gate electrode 321, gate dielectric 322, sidewall spacer 347, lightly doped drains 323, source 324 and drain 325, with a silicide layer 319 on the source 324, drain 325 and gate electrode 321 for the case the gate electrode 321 comprises polysilicon.

EXAMPLES

Disclosed embodiments are further illustrated by the following specific Examples, which should not be construed as limiting the scope or content of this Disclosure in any way.

Figure 4:
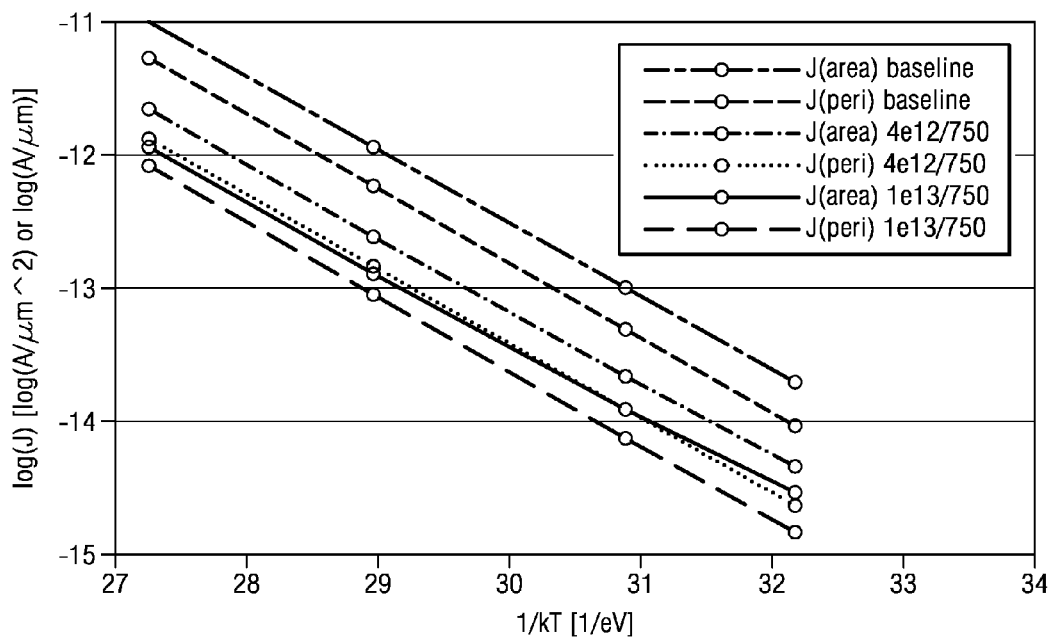
FIG. 4 provides data showing the log of nwell reverse leakage current (I) as a function of inverse temperature (1/kT) with and without example leakage reduction high energy implants described above relative to FIG. 2A. A 5 to 8× reduction in junction leakage for a disclosed nwell diode is shown as compared to a baseline nwell diode that did not include any disclosed high energy implant.

Technology computer-aided design (TCAD) simulations were performed to simulate nwell diodes with disclosed additional high energy implants which position dopants in the semiconductor surface below the bottom of the nwell depletion region to demonstrate a reduction in reverse leakage current as compared to controls (identified as "baseline") not including any disclosed high energy implant. FIG. 4 provides data showing the log of nwell reverse leakage current (I) as a function of inverse temperature (1/kT) with and without example leakage reduction high energy implants described above relative to FIG. 2A. The bias conditions used was the rated Vdd of the nwell+10%; in this case, 3.6V (reverse bias). A 5 to 8× reduction in junction leakage for a disclosed nwell diode is shown as compared to a baseline nwell diode that did not include any disclosed high energy implant.

Advantages of disclosed embodiments include no need for additional masks and associated additional cost. Blanket high energy implants can be added to existing process flows without measurably altering other device properties. As evidenced in FIG. 4, standby leakage can be reduced by up to an order of magnitude, which can reduce IC standby power for disclosed ICs.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of forming a Metal-Oxide Semiconductor (MOS) transistor, comprising:
    forming a well doped with a second doping type in a semiconductor surface doped with a first dopant type having a baseline doping level, said well forming a well-substrate junction having a well depletion region;
    ion implantation with said first dopant type at a dose and energy to form a retrograde doped region below said well-substrate junction having a peak first dopant concentration of between five (5) and one hundred (100) times above said baseline doping level at a location of said peak first dopant concentration, wherein with zero bias across said well-substrate junction at least (>) ninety (90) % of a total dose of said retrograde doped region is below a bottom of said well depletion region;
    forming a gate structure on said well, and
    forming source and drain regions on opposing sides of said gate structure.

2. The method of claim 1, wherein with three (3) volt reverse bias across said well-substrate junction at least (>) ninety (90) % of a total dose of said retrograde doped region is between said bottom of said well depletion region and one diffusion length below said bottom of said well depletion region.

3. The method of claim 1, wherein said first dopant type is boron, said well is an n-well, said semiconductor surface is a p− surface, and said dose is $2 \times 10^{12}$ c to $3 \times 10^{13}$ cm$^{-2}$ and wherein said energy is from 400 keV to 1.8 MeV.

4. The method of claim 1, wherein said energy includes at least two different energies.

5. The method of claim 1, wherein said well comprises a plurality of nwells and said method comprises a method of forming a complementary MOS (CMOS) integrated circuit (IC) comprising a plurality of p-channel MOS transistors outside said plurality of nwells and a plurality of p-channel MOS transistor formed in said plurality of nwells.

6. The method of claim 5, wherein said retrograde doped region is a blanket doped region.

7. The method of claim 5, wherein said retrograde doped region is a patterned region, and wherein a portion of said plurality of nwells do not include said retrograde doped region.

8. A Metal-Oxide Semiconductor (MOS) transistor, comprising:
    a substrate having a semiconductor surface doped with a first dopant type having a baseline doping level, a well formed in said semiconductor surface doped with a second doping type, said well forming a well-substrate junction having a well depletion region;

a retrograde doped region below said well-substrate junction doped with said first dopant type having a peak first dopant concentration of between five (5) and one hundred (100) times above said baseline doping level at a location of said peak first dopant concentration, wherein with zero bias across said well-substrate junction at least (>) ninety (90) % of a total dose of said retrograde doped region is below a bottom of said well depletion region;

a gate structure on said well, and source and drain regions on opposing sides of said gate structure.

9. The MOS transistor of claim 8, wherein said well is an n-well, and said semiconductor surface is a p− surface.

10. The MOS transistor of claim 8, wherein said well is a p-well and said semiconductor surface is an n− surface.

11. The MOS transistor of claim 8, wherein said retrograde doped region includes at least two peaks including said peak first dopant concentration and another peak.

12. The MOS transistor of claim 1, wherein with three (3) volt reverse bias across said well-substrate junction at least (>) ninety (90) % of a total dose of said retrograde doped region is between said bottom of said well depletion region and one diffusion length below said bottom of said well depletion region.

13. An integrated circuit (IC), comprising:
a substrate having a semiconductor surface doped with a first dopant type having a baseline doping level,
a plurality of wells formed in said semiconductor surface doped with a second doping type each forming a well-substrate junction having a well depletion region;
a plurality of p-channel or n-channel Metal-Oxide Semiconductor (MOS) transistor formed in said plurality of wells including:

a gate structure on said plurality of wells;
source and drain regions on opposing sides of said gate structure, and
a retrograde doped region below said well-substrate junction doped with said first dopant type having a peak first dopant concentration of between five (5) and one hundred (100) times above said baseline doping level at a location of said peak first dopant concentration, wherein with zero bias across said well-substrate junction at least (>) ninety (90) % of a total dose of said retrograde doped region is below a bottom of said well depletion region.

14. The IC of claim 13, wherein said IC is a complementary MOS (CMOS) IC including said plurality of p-channel MOS transistors formed in said plurality of wells, further comprising a plurality of n-channel MOS transistors formed in said semiconductor surface.

15. The IC of claim 13, wherein said plurality of wells are n-wells, and wherein said plurality of p-channel or n-channel MOS transistors are said p-channel MOS transistors.

16. The IC of claim 13, wherein said plurality of wells are p-wells and wherein said plurality of p-channel or n-channel MOS transistors are said n-channel MOS transistors.

17. The IC of claim 13, wherein said retrograde doped region is a blanket doped region.

18. The IC of claim 15, wherein said retrograde doped region is a patterned region, and wherein a portion of said plurality of n-wells do not include said retrograde doped region.

19. The IC of claim 13, wherein with three (3) volt reverse bias across said well-substrate junction at least (>) ninety (90) % of a total dose of said retrograde doped region is between said bottom of said well depletion region and one diffusion length below said bottom of said well depletion region.

* * * * *